(12) United States Patent
Ando et al.

(10) Patent No.: US 9,870,953 B2
(45) Date of Patent: Jan. 16, 2018

(54) SYSTEM ON CHIP MATERIAL CO-INTEGRATION

(71) Applicant: International Business Machines Corporation, Armonk, NY (US)

(72) Inventors: Takashi Ando, Tuckahoe, NY (US); Lukas Czornomaz, Zurich (CH); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 10 days.

(21) Appl. No.: 14/922,251

(22) Filed: Oct. 26, 2015

(65) Prior Publication Data

US 2017/0117187 A1    Apr. 27, 2017

(51) Int. Cl.
*H01L 21/00* (2006.01)
*H01L 21/8238* (2006.01)
*H01L 21/84* (2006.01)
*H01L 21/324* (2006.01)
*H01L 29/66* (2006.01)
*H01L 29/04* (2006.01)
*H01L 27/092* (2006.01)
*H01L 27/12* (2006.01)

(52) U.S. Cl.
CPC .... *H01L 21/823807* (2013.01); *H01L 21/324* (2013.01); *H01L 21/823821* (2013.01); *H01L 21/84* (2013.01); *H01L 27/0924* (2013.01); *H01L 27/1211* (2013.01); *H01L 29/045* (2013.01); *H01L 29/66545* (2013.01)

(58) Field of Classification Search
None
See application file for complete search history.

(56) References Cited

U.S. PATENT DOCUMENTS

| | | |
|---|---|---|
| 7,977,178 B2 | 7/2011 | Kim et al. |
| 8,299,509 B2 | 10/2012 | Kim et al. |
| 8,937,299 B2 | 1/2015 | Basu et al. |
| 2014/0203327 A1 | 7/2014 | Pillarisetty et al. |
| 2015/0041856 A1 | 2/2015 | Cheng et al. |
| 2015/0044859 A1 | 2/2015 | Cheng et al. |
| 2015/0171205 A1 | 6/2015 | Then et al. |

OTHER PUBLICATIONS

Czornomaz et al., "Confined Epitaxial Lateral Overgrowth (CELO): A Novel Concept for Scalable Integration of CMOS-compatible InGaAs-on-insulator MOSFETs on Large-Area Si Substrates," 2015 Symposium on VLSI Technology Digest of Technical Papers, pp. 1-2.

*Primary Examiner* — Reema Patel
(74) *Attorney, Agent, or Firm* — Erik K. Johnson

(57) ABSTRACT

A method, and the resulting structure, of a semiconductor device where a first and second gate structure is formed above a Semiconductor-on-Insulator (SOI) material. Following any detrimental processes used to form the first gate structure, the base semiconductor material is exposed and the semiconductor material beneath the second gate structure is removed. A new semiconductor material is grown from the exposed base semiconductor material, and through the second gate structure, creating a device having FET and FinFET devices containing 2 different semiconductor materials.

15 Claims, 10 Drawing Sheets

US 9,870,953 B2

SYSTEM ON CHIP MATERIAL CO-INTEGRATION

BACKGROUND

The present invention relates to semiconductor devices, and particularly to forming field effect transistors having different materials.

Field effect transistors (FETs) are commonly employed in electronic circuit applications. FETs may include a source region and a drain region spaced apart by a semiconductor channel region. A gate, including a gate dielectric layer, a work function metal layer, and a metal electrode, may be formed above the channel region. By applying voltage to the gate, the conductivity of the channel region may increase and allow current to flow from the source region to the drain region.

Fin field effect transistors (FinFETs) are an emerging technology which may provide solutions to field effect transistor (FET) scaling problems at, and below, the 22 nm node. FinFET structures may include at least a narrow semiconductor fin gated on at least two sides of each of the semiconductor fin, as well as a source region and a drain region adjacent to the fin on opposite sides of the gate. FinFET structures having n-type source and drain regions may be referred to as nFinFETs, and FinFET structures having p-type source and drain regions may be referred to as pFinFETs.

In some FinFET structures, different materials may be used for the fins of pFinFETs and nFinFETs in order to improve device performance. However, a material that may improve pFinFET performance may reduce nFET performance, and vice versa. For example, while pFinFET performance may be improved by forming fins made of silicon-germanium, nFinFET performance may instead be improved by forming fins made of undoped or carbon-doped silicon and may be degraded by forming fins made of silicon-germanium. Further, pFinFETs and nFinFETs are fabricated on the same substrate.

BRIEF SUMMARY

An embodiment of the invention may include a method of manufacturing a semiconductor device. The method may include forming a first gate structure on a first region of a semiconductor-on-insulator substrate. The semiconductor-on-insulator substrate includes a first semiconductor-on-insulator layer located on an insulator layer, and the insulator layer is located on a base semiconductor layer. The first gate structure comprises a first gate structure located above the first semiconductor-on-insulator layer, and a first source/drain sandwiching the first gate structure. The method may include forming a second gate structure in a second region of the semiconductor-on-insulator substrate. The second gate structure is located above the first semiconductor-on-insulator layer. The method may include removing a first portion of the second region to expose a first growth portion of the base semiconductor layer in the second region. The method may include removing the first semiconductor-on-insulator layer in the second region. Removing the semiconductor-on-insulator layer includes removing the semiconductor-on-insulator layer beneath the second gate forming a gate void. The method may include forming a second semiconductor-on-insulator layer through the gate void. The second semiconductor-on-insulator layer is epitaxially grown from the first growth portion of the base semiconductor layer in the second region.

An embodiment of the invention may include a semiconductor structure. The semiconductor structure may include a first gate structure in a first region of a semiconductor on insulator substrate. The first region of the semiconductor on insulator substrate includes a first semiconductor-on-insulator layer located on an insulator layer, and the insulator layer is located on a base semiconductor layer. The first semiconductor-on-insulator layer comprises is either silicon or silicon-germanium. The semiconductor structure may include a second gate structure in a second region of a semiconductor on insulator substrate. The second region of the semiconductor on insulator substrate includes a second semiconductor-on-insulator layer located on the insulator layer, and the insulator layer is located on the base semiconductor layer. The second semiconductor-on-insulator includes either germanium, a III-V semiconductor compound or a II-VI semiconductor compound.

BRIEF DESCRIPTION OF THE SEVERAL DRAWINGS

Figure 1:
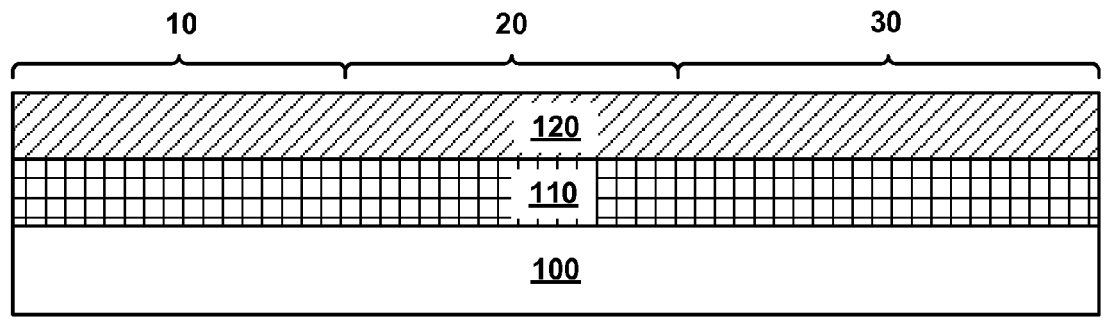
FIG. 1 is a cross-sectional view depicting a Semiconductor-on-Insulator (SOI) substrate.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Non-silicon-based semiconductor materials are increasingly being used due to better material qualities. For example, III-V semiconductor materials (i.e. materials composed of elements from the third group and fifth group of the periodic table) are attractive when building increasingly small semiconductor structures due to their lower effective mass, and compatibility to low power supply, $V_{DD}$, applications (due to the lower bandgap than Silicon-based materials). For System on chip (SOC) applications, high-$V_{DD}$ materials like silicon (Si), or silicon germanium (SiGe), are required for I/O or ultra-low power devices. Typically, Si or SiGe devices require very high process temperatures (in the range of 800° C. to ~1100° C.) during formation of the semiconductor structures. Such temperatures may deteriorate non-silicon-based semiconductor materials, such as III-V materials. By forming such structures after high temperature anneals occur may allow for creating high performance device using temperature, or process, sensitive materials while still enabling the creation of other silicon-based structures for SOC applications.

Referring to FIG. 1 a Semiconductor-on-Insulator (SOI) substrate may be used, which includes a buried insulator layer 110 below an SOI layer 120, and a base semiconductor layer 100 below the buried insulator layer 110. The buried insulator layer 110 may isolate the SOI layer 120 from the base semiconductor layer 100. The base semiconductor layer 100 may be made from any of several known semiconductor materials such as, for example, silicon, germanium, silicon-germanium alloy, carbon-doped silicon, carbon-doped silicon-germanium alloy, and compound (e.g. III-V and II-VI) semiconductor materials. Non-limiting examples of compound semiconductor materials include gallium arsenide, indium arsenide, and indium phosphide. Typically the base semiconductor layer 100 may be approximately, but is not limited to, several hundred microns thick. For example, the base semiconductor layer 100 may have a thickness ranging from approximately 0.5 mm to approximately 1.5 mm. The SOI substrate may contain a first region 10, a second region 20 and a third region 30 which may be effectively undergo different processing steps, in order to create Field Effect Transistor (FET) or FinFET devices having different material qualities.

The buried insulator layer 110 may be formed from any of several dielectric materials. Non-limiting examples include, for example, oxides, nitrides, oxynitrides of silicon, and combinations thereof. Oxides, nitrides and oxynitrides of other elements are also envisioned. In addition, the buried insulator layer 110 may include crystalline or non-crystalline dielectric material. The buried insulator layer 110 may be 40-500 nm thick.

The SOI layer 120 may be made of any of the several semiconductor materials possible for the base semiconductor layer 100. In general, the base semiconductor layer 100 and the SOI layer 120 may include either identical or different semiconducting materials with respect to chemical composition, dopant concentration and crystallographic orientation. In a preferred embodiment, the SOI layer 120 comprises silicon, silicon-germanium, or carbon-doped silicon. The SOI layer 120 may be doped with p-type dopants, such as boron, or doped with n-type dopants, such as phosphorus and/or arsenic. The dopant concentration may range from approximately $1 \times 10^{15}$ cm$^{-3}$ to approximately $1 \times 10^{19}$ cm$^{-3}$, preferably approximately $1 \times 10^{15}$ cm$^{-3}$ to approximately $1 \times 10^{16}$ cm$^{-3}$. In one embodiment, the SOI layer 120 is undoped. The SOI layer 120 may have a thickness ranging from approximately 1 nm to approximately 300 nm, preferably approximately 30 nm. In embodiments where a FinFET device is created, SOI layer 120 may be etched into a fin structure using techniques known in the art such as, for example, sidewall image transfer.

Figure 2:
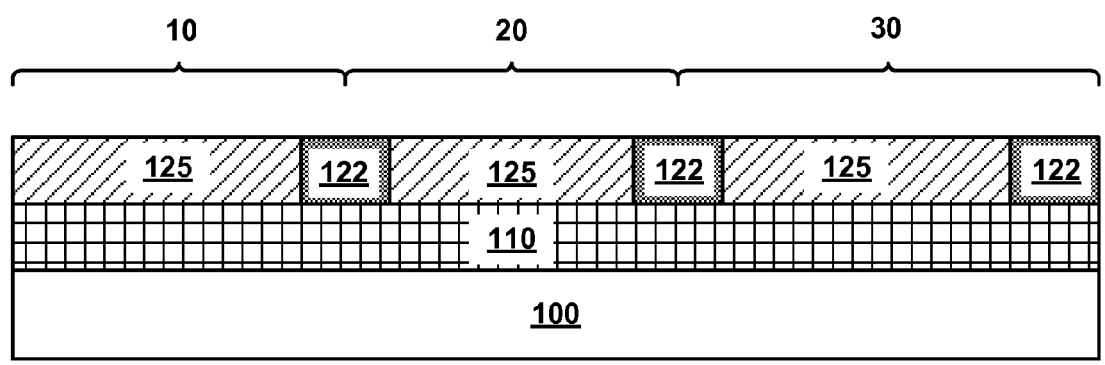
FIG. 2 is a cross-sectional view depicting formation of a first region, a second region and a third region separated by a STI.

Referring to FIG. 2, a trench may be formed in the SOI layer between the first region 10 and second region 20, as well as between the second region 20 and the third region 30, using lithographic patterning and etching of the material, forming a first SOI layer 125 in each region. The trench may be created with a thickness and depth to reduce current leakage between the regions once the trench has been filled with a dielectric material. The trench may be formed using a photolithography process followed by an anisotropic etching process such as reactive ion etching (RIE) or plasma etching.

A shallow trench isolation (STI) layer 122 may be deposited in the formed trench, and optionally above the first SOI layer 125. In such embodiments, the STI layer 122 may be any suitable oxide, nitride or oxynitride, such as, for example, silicon oxide, silicon nitride or silicon oxynitride. Deposition of the STI layer 122 may be performed by any suitable method known in the art such as, for example, CVD, or spin-on deposition. Following deposition the STI layer 122 may be planarized using, for example, chemical mechanical planarization (CMP), so that the top surface of the STI layer 122 is co-planar, or substantially co-planar, with the first SOI layer 125.

Figure 3:
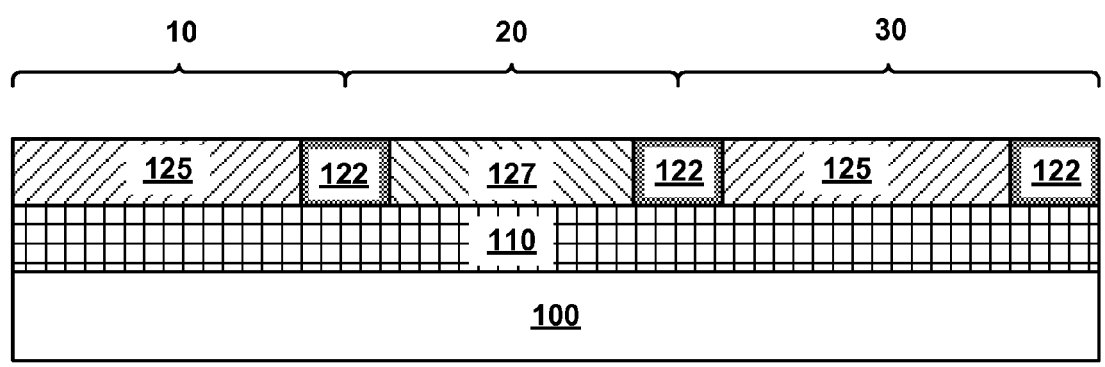
FIG. 3 is a cross-sectional view depicting doping the second region.

Referring to FIG. 3, the first SOI layer 125 of the second region 20 may be replaced with a second SOI layer 127. A masking layer may be formed above the first region 10 and third region 30 of the first SOI layer 125. The masking layer may be deposited to protect the SOI layer 120 during subsequent processing and doping steps. In an exemplary embodiment, the masking layer may be made of oxides, nitrides, and oxynitrides of silicon, as well as oxides, nitrides, and oxynitrides of other elements, and may have a thickness of approximately 2 nm to approximately 10000 nm, preferably approximately 2 nm to approximately 200 nm. The masking layer may be deposited using any suitable method known in the art such as, for example, chemical vapor deposition (CVD), or spin-on deposition, and then may be etched to expose the second region 20 of the SOI layer 120. The masking layer may be etched using lithographic patterning and etching techniques typically known in the art, such as reactive ion etching (RIE) and plasma etching.

Still referring to FIG. 3, the second SOI layer 127 of the second region 20 may created using any number of known techniques. In one embodiment, the second SOI layer 127 may be created by epitaxially growing a layer of semiconductor material above the first SOI layer 125, and subsequently annealing the structure to allow chemical species to migrate into the first SOI layer 125, changing its chemical makeup to that of the second SOI layer 127. In additional embodiments, a portion of SOI layer 125 may be removed, using any suitable etching process, prior to epitaxial growth to increase the resultant concentration of the second SOI layer 127. The materials chose for the second SOI layer 127 should be able, or even require, process having high temperatures (>1000° C.). In an example embodiment, the semiconductor material may be silicon-germanium or carbon doped silicon. The semiconductor material may further include additional dopants such as boron, phosphorus and arsenic. Following the anneal, CMP may be performed to remove the masking layer, and make the second SOI layer 127 co-planar, or substantially co-planar, with the first SOI layer 125.

The terms "epitaxial growth and/or deposition" and "epitaxially formed and/or grown" mean the growth of a semiconductor material on a deposition surface of a semiconductor material, in which the semiconductor material being grown may have the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth and/or deposition processes may be selective to forming on semiconductor surfaces, and may not deposit material on dielectric surfaces, such as silicon dioxide or silicon nitride surfaces.

Figure 4:
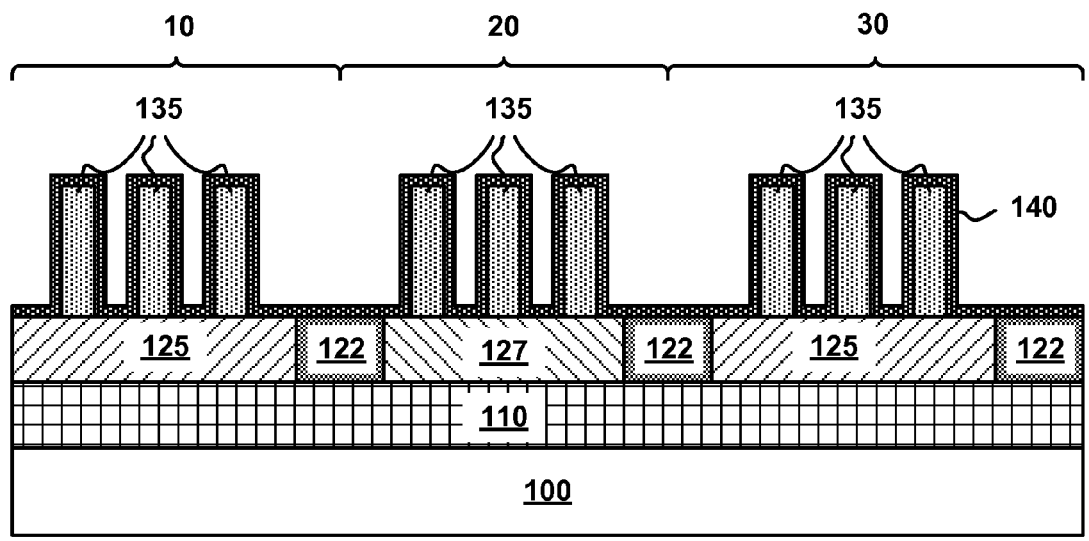
FIG. 4 is a cross-sectional view depicting forming dummy gates and spacers above each region.

Referring to FIG. 4, a dummy gate 135 may be formed above the first SOI layer 125 and second SOI layer 127. In instances where the first SOI layer 125 and second SOI layer 127 are formed into fins, the dummy gate 135 may be substantially perpendicular to the fin, where the fin passes through the dummy gate 135. The dummy gate 135 may be formed on, and cross over, a channel region of the first SOI layer 125 and doped SOI layer 127. A source/drain region of the FET or FinFET may be located in the regions of the first SOI layer 125 and second SOI layer 127 not covered by the dummy gate 135. The dummy gate 135 may have a height of approximately 40 nm to approximately 200 nm, preferably approximately 50 nm to approximately 150 nm. The dummy gate 135 may include a sacrificial gate structure, which may include a dummy gate dielectric (not shown), a dummy gate material (not shown) and a hardmask (not shown), that may be later removed and replaced by a replacement gate dielectric, work function metal and a replacement gate electrode. In an example embodiment, the dummy gate material may be made of a polysilicon material. In an example embodiment, the dummy gate dielectric (e.g., silicon oxide) formed using known deposition techniques known in the art, including, for example, atomic layer deposition (ALD), CVD, physical vapor deposition (PVD), molecular beam deposition (MBD), pulsed laser deposition (PLD), or liquid source misted chemical deposition (LSMCD), sputtering, and plating. In some embodiments, the hardmask may be made of an insulating material, such as, for example, silicon nitride or silicon oxide, capable of protecting the dummy gate 135 during subsequent processing steps.

Still referring to FIG. 4, a spacer layer 140 may be formed on the exposed surfaces of the dummy gate 135, first SOI layer 125, second SOI layer 127, and STI layer 122. The spacer layer 140 may be made of any suitable insulating material, such as silicon nitride, silicon oxide, silicon oxynitrides, or a combination thereof, and may have a thickness ranging from 2 nm to approximately 25 nm. The spacer layer 140 may be formed by any method known in the art, such as conformal deposition. Further, in various embodiments, the spacer layer 140 may include one or more layers.

Figure 5:
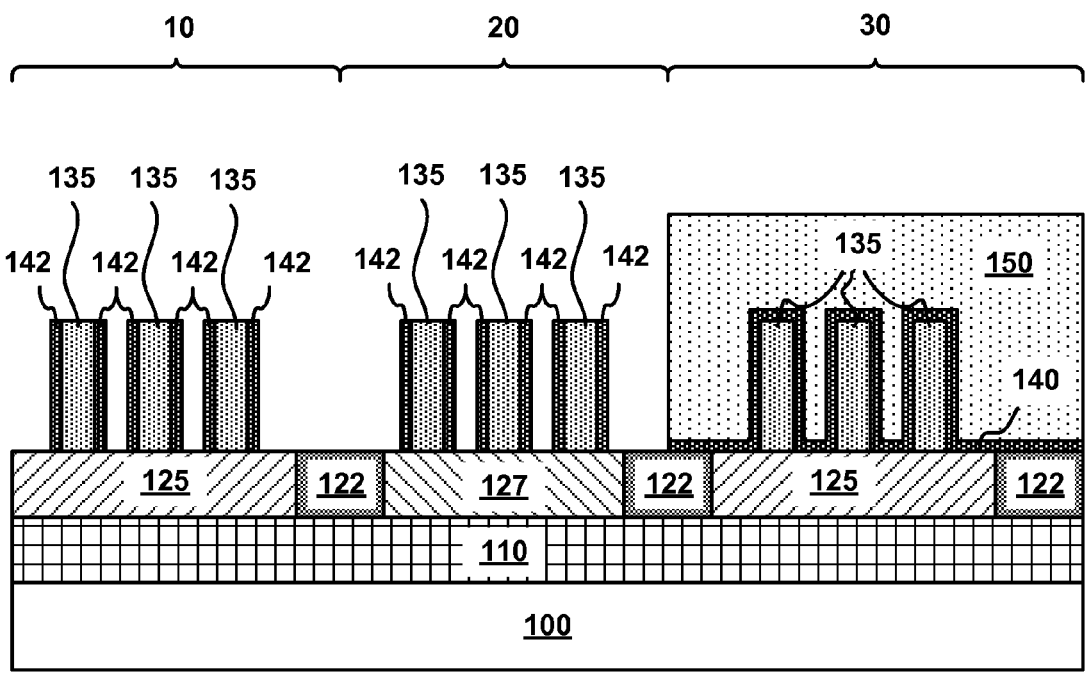
FIG. 5 is a cross-sectional view depicting masking a third region and performing an anisotropic etch on the first and second region.

Referring to FIG. 5, a third region mask 150 may be formed on the third region 30, and an anisotropic etch of the first region 10 and second region 20 may be performed to create spacers 142 in the first region 10 and second region 20. The third region mask 150 may be deposited to protect the third region 30 during subsequent processing and doping steps. In an exemplary embodiment, the third region mask 150 may be made of oxides, nitrides, and oxynitrides of silicon, as well as oxides, nitrides, and oxynitrides of other elements, and may have a thickness of approximately 2 nm to approximately 10000 nm, preferably approximately 2 nm to approximately 200 nm. The third region mask 150 may be deposited using any suitable method known in the art such as, for example, CVD, or spin-on deposition, and then followed by conventional lithography, may be etched to expose the first region 10 and the second region 20. The masking layer may be etched using lithographic patterning and etching techniques typically known in the art, such as reactive ion etching (RIE) and plasma etching. Additionally, the exposed horizontal surfaces of the spacer layer 140 may be removed during the RIE process to form spacers 142 in the first region 10 and the second region 20.

Figure 6:
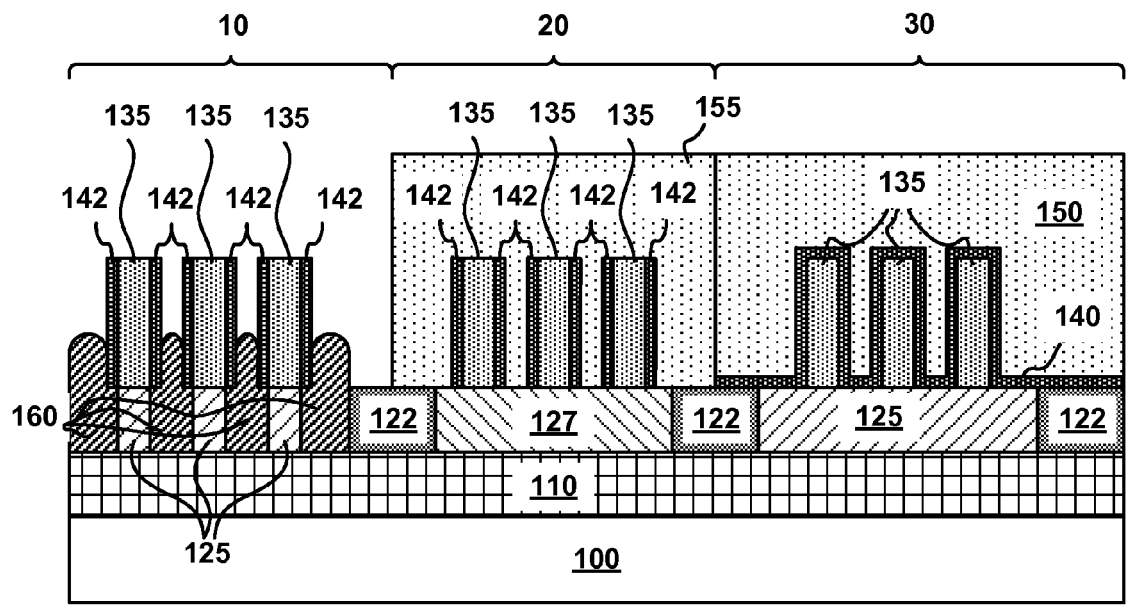
FIG. 6 is a cross-sectional view depicting forming a S/D Junction in the first region.

Referring to FIG. 6 the second region 20 is masked, forming a second region mask 155, and a first source/drain 160 is formed in the first region 10. The second region mask 155 may be deposited to protect the second region 20 during subsequent processing and doping steps. In an exemplary embodiment, the second region mask 155 may be made of oxides, nitrides, and oxynitrides of silicon, as well as oxides, nitrides, and oxynitrides of other elements, and may have a thickness of approximately 2 nm to approximately 10000 nm, preferably approximately 2 nm to approximately 200 nm. The material of the second region mask 155 may be selected so that it may be selectively etched, with regards to the third region mask 150. The second region mask 155 may be deposited using any suitable method known in the art such as, for example, CVD, or spin-on deposition, and then may be etched to expose the first region 10. The masking layer may be etched using lithographic patterning and etching techniques typically known in the art, such as RIE and plasma etching. Additionally, the exposed horizontal surfaces of the spacer layer 140 may be removed during the RIE process to form spacers 142 in the first region 10 and the second region 20.

The first source/drain 160 is formed in the source/drain region of the first SOI layer 125. The first source/drain 160 may result from a semiconductor material epitaxially grown on the first SOI layer 125 and annealed. In some embodiments, a semiconductor material may be epitaxially grown on the existing crystal lattice of the first SOI layer 125 in the first region 10. In an example embodiment, the semiconductor material may be silicon-germanium. In such an embodiment, the semiconductor material may contain, for example, approximately 20% to approximately 100% germanium, approximately 0% to approximately 80% silicon, and may be doped with p-type dopants such as boron in concentrations ranging from approximately $1\times10^{20}$ atoms/$cm^3$ to approximately $2\times10^{21}$ atoms/$cm^3$. In another example embodiment, the semiconductor material may be carbon doped silicon. In such an embodiment, the semiconductor material may contain, for example, approximately 0.5% to approximately 2.5% carbon, approximately 97.5% to approximately 99.5% silicon, and may be doped with n-type dopants such as arsenic or phosphorus in concentrations ranging from approximately $1\times10^{20}$ atoms/$cm^3$ to approximately $2\times10^{21}$ atoms/$cm^3$.

Additionally, ion implantation may performed to introduce desired dopants into the first SOI layer 125 in the first region 10. In some embodiments, dopants may include any suitable semiconductor dopant such as, for example, Boron, Arsenic, Phosphorus and combinations thereof. The dopant may be implanted in concentrations ranging from approximately $1\times10^{18}$ atoms/$cm^3$ to approximately $5\times10^{19}$ atoms/$cm^3$.

Following the epitaxial growth and/or ion implantation, an anneal may be performed. The anneal may cause the dopants in the epitaxially grown material, or from ion implantation, to migrate from areas of high concentration to low concentration, which may result in the formation of a substantially uniform first source/drain 160 in areas not below the dummy gate 135, and may allow for extension of the source drain underneath the spacers 142. The anneal may be performed at temperatures ranging from approximately 600° Celsius to approximately 1200° Celsius and may be performed for approximately 10 to approximately 30 seconds. In some embodiments, the annealing temperature may be substantially uniform throughout the annealing period, however in other embodiments the annealing period include one or more ramping cycles where the temperature is decreased or increased.

Figure 7:
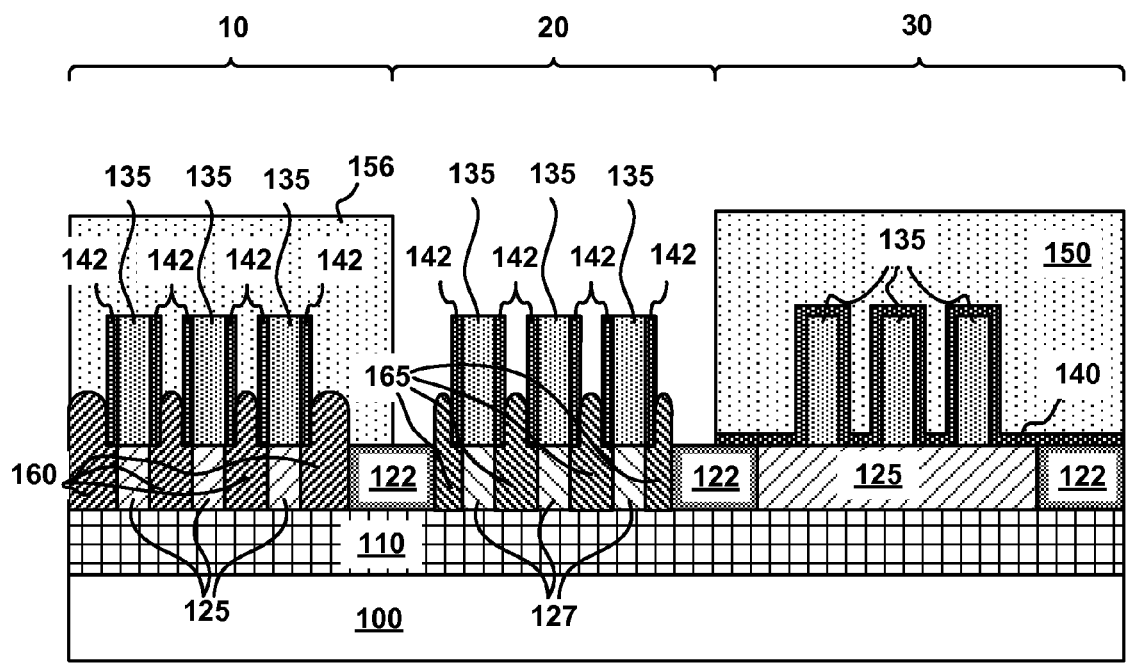
FIG. 7 is a cross-sectional view depicting forming a S/D Junction in the second region.

Referring to FIG. 7 the second region mask 155 is removed and the first region 10 is masked, forming first region mask 156, and a second source/drain 165 is formed in the second region 20. The second region mask 155 may be removed using any suitable etching techniques or chemicals that would remove the second region mask 155, without damaging the first region 10 or removing the third region mask 150. The first region mask 156 may be deposited to protect the first region 10 during subsequent processing and doping steps. In an exemplary embodiment, the first region mask 156 may be made of oxides, nitrides, and oxynitrides of silicon, as well as oxides, nitrides, and oxynitrides of other elements, and may have a thickness of approximately 2 nm to approximately 10000 nm, preferably approximately 2 nm to approximately 200 nm. The material of the first region mask 156 may be selected so that it may be selectively etched, with regards to the third region mask 150. The first region mask 156 may be deposited using any suitable method known in the art such as, for example, CVD, or spin-on deposition, and then may be etched to expose the second region 20. The first region mask 156 may be etched using lithographic patterning and etching techniques typically known in the art, such as reactive ion etching (RIE) and plasma etching.

The second source/drain 165 is formed in the source/drain region of the second SOI layer 127. The second source/drain 165 may result a semiconductor material epitaxially grown on the second SOI layer 127 and annealed. In some embodiments, a semiconductor material may be epitaxially grown on the existing crystal lattice of the second SOI layer 127 in the first region 10. In an example embodiment, the semiconductor material may be silicon-germanium. In such an embodiment, the semiconductor material may contain, for example, approximately 20% to approximately 100% germanium, approximately 0% to approximately 80% silicon, and may be doped with p-type dopants such as boron in concentrations ranging from approximately $1\times10^{20}$ atoms/$cm^3$ to approximately $2\times10^{21}$ atoms/$cm^3$. In another example embodiment, the semiconductor material may be carbon doped silicon. In such an embodiment, the semiconductor material may contain, for example, approximately 0.5% to approximately 2.5% carbon, approximately 97.5% to approximately 99.5% silicon, and may be doped with n-type dopants such as arsenic or phosphorus in concentrations ranging from approximately $1\times10^{20}$ atoms/$cm^3$ to approximately $2\times10^{21}$ atoms/$cm^3$.

The terms "epitaxial growth and/or deposition" and "epitaxially formed and/or grown" mean the growth of a semiconductor material on a deposition surface of a semiconductor material, in which the semiconductor material being grown may have the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth and/or deposition processes may be selective to forming on semiconductor surfaces, and may not deposit material on dielectric surfaces, such as silicon dioxide or silicon nitride surfaces.

Additionally, ion implantation may performed to introduce desired dopants into the second SOI layer 127 in the first region 10. In some embodiments, dopants may include any suitable semiconductor dopant such as, for example, Boron, Arsenic, Phosphorus and combinations thereof. The dopant may be implanted in concentrations ranging from approximately $1 \times 10^{18}$ atoms/cm$^3$ to approximately $5 \times 10^{19}$ atoms/cm$^3$.

Following the epitaxial growth and/or ion implantation, an anneal may be performed. The anneal may cause the dopants in the epitaxially grown material, or from ion implantation, to migrate from areas of high concentration to low concentration, which may result in the formation of a substantially uniform second source/drain 165 in areas not below the dummy gate 135, and may allow for extension of the source drain underneath the spacers 142. The anneal may be performed at temperatures ranging from approximately 600° Celsius to approximately 1100° Celsius and may be performed for approximately 10 to approximately 30 second. In some embodiments, the annealing temperature may be substantially uniform throughout the annealing period, however in other embodiments the annealing period include one or more ramping cycles where the temperature is decreased or increased.

Figure 8:
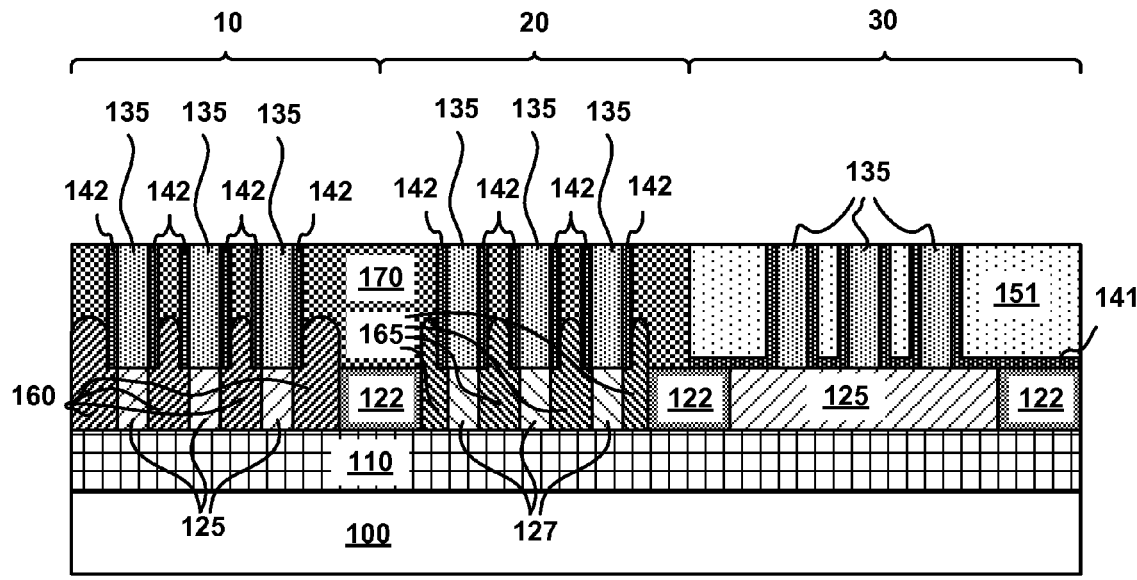
FIG. 8 is a cross-sectional view depicting depositing an ILD in the first and second region, and performing CMP on the three regions.

Referring to FIG. 8, the first region mask 156 may be removed and an inter-layer dielectric (ILD) 170 may be deposited to surround the dummy gates 135 and spacers 142 in the first region 10 and second region 20. The ILD 170 may include any suitable dielectric material, for example, silicon oxide, silicon nitride, hydrogenated silicon carbon oxide, silicon based low-k dielectrics, flowable oxides, porous dielectrics, or organic dielectrics including porous organic dielectrics and may be formed using any suitable deposition techniques including ALD, CVD, plasma enhanced CVD, spin on deposition, or PVD. In some embodiments, the ILD 170 may be a dummy ILD. In some embodiments, various barriers or liners (not shown) may be formed below the ILD 170. After deposition, the ILD 170 may be planarized, using, for example, CMP to remove excess material and expose the dummy gate 135 in the first region 10, second region 20 and third region 30, so that the ILD 170 has approximately the same height. Additionally, this causes the third region mask 150 to decrease in height to a planarized third region mask, where the planarized third region mask 151 is substantially co-planar to the top surface of the ILD 170 in the first region 10 and second region 20, and the portion of the spacer layer 140 is removed above the dummy gate 135 in the third region 30, creating a partial spacer layer 141.

Figure 9:
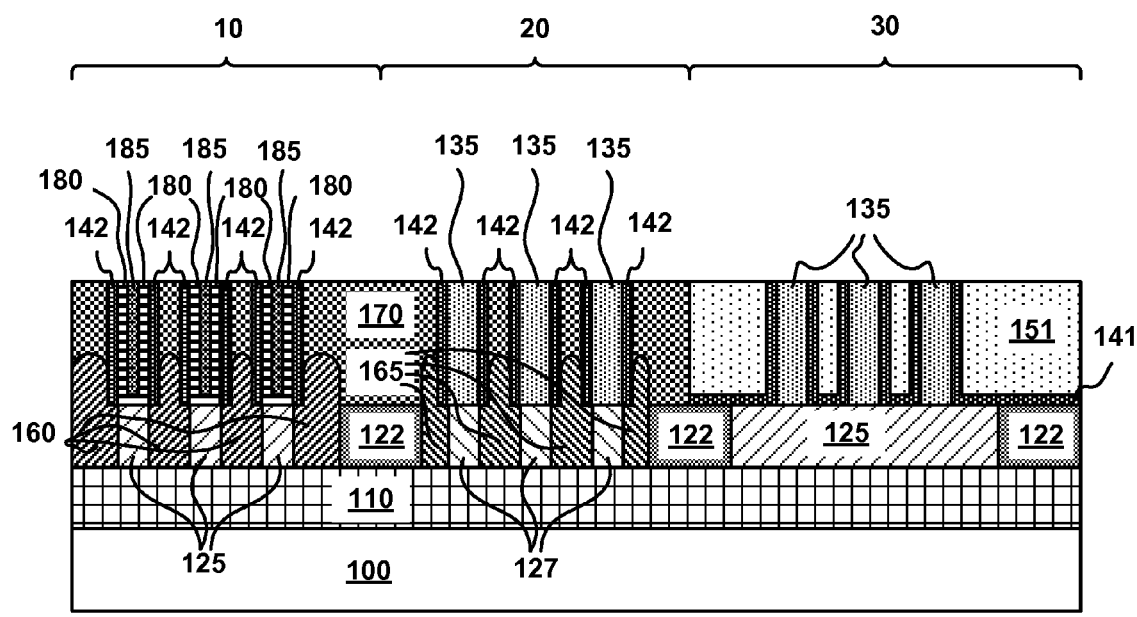
FIG. 9 is a cross-sectional view depicting depositing a gate stack and metal gate in the first region.

Referring to FIG. 9, the second region 20 and third region 30 may be masked and the dummy gate 135 in the first region 10 may be replaced with a replacement metal gate (i.e. a first replacement gate dielectric 180, work function layer (not shown) and a first replacement gate electrode 185). In an exemplary embodiment, the second and third region mask may be made of oxides, nitrides, and oxynitrides of silicon, as well as oxides, nitrides, and oxynitrides of other elements, and may have a thickness of approximately 2 nm to approximately 10000 nm, preferably approximately 2 nm to approximately 200 nm. The second and third region mask may be deposited using any suitable method known in the art such as, for example, CVD, or spin-on deposition, and then may be etched to expose the first region 10. The second and third region mask may be etched using lithographic patterning and etching techniques typically known in the art, such as RIE and plasma etching.

The dummy gate 135 may be removed from the first region 10 by selectively etching the dummy gate using an isotropic or an anisotropic etching process such as, for example, RIE, wet etching or plasma etching (not shown).

Following the removal of the dummy gate, a first replacement gate dielectric 180 may be deposited. In one embodiment, the first replacement gate dielectric 180 may include silicon oxide ($Si_xO_y$) or a high-k oxide such as, for example, hafnium oxide ($Hf_xO_y$), zirconium oxide ($Zr_xO_y$), aluminum oxide ($Al_xO_y$), titanium oxide ($Ti_xO_y$), lanthanum oxide ($La_xO_y$), strontium titanium oxide ($Sr_xTi_yO_z$), lanthanum aluminum oxide ($La_xAl_yO_z$), and mixtures thereof. The first replacement gate dielectric 180 may be deposited over the first SOI layer 125 using any suitable deposition technique known the art, including, for example, ALD, CVD, PVD, MBD, PLD, or LSMCD.

Following the deposition of the first replacement gate dielectric 180, in some embodiments a work function metal layer may be deposited. The work function metal layer may include, for example, aluminum, lanthanum oxide, platinum, titanium, tungsten, tungsten nitride, magnesium oxide, strontium titanate, strontium oxide, TiN, TaN. The work function metal layer may be formed using any suitable metal deposition technique, including, for example, CVD, PVD, and ALD, sputtering, and plating.

In some embodiments, a high temperature anneal may be performed prior to the deposition of the gate electrode. The high temperature anneal may be performed in order to increase the performance of the replacement metal gate stack. The high temperature anneal may be performed at temperatures ranging from approximately 600° Celsius to approximately 1100° Celsius and may be annealed for approximately a few milliseconds to approximately 30 second. In some embodiments, the annealing temperature may be substantially uniform throughout the annealing period, however in other embodiments the annealing period include one or more ramping cycles where the temperature is decreased or increased. Following the anneal, additional work function metal layers, dielectric layer or any other layers known in the art may be deposited. The high temperature anneal is performed such that the threshold voltage of the gate does not change following prolonged usage or cycling. Additionally, the high temperature anneal may be at such a temperature that subsequently formed semiconductor materials, such as the third SOI layer 225 (FIG. 16), would deteriorate under those process conditions. Deterioration of the semiconductor material may include changes in the structural integrity of the semiconductor material, such as changes in the bonding characteristics of the atoms in the crystal lattice.

A first replacement gate electrode 185 may be deposited above the first replacement gate dielectric 180 or work function layer. The first replacement gate electrode 185 may be made of gate conductor materials including, but not limited to, zirconium, tungsten, tantalum, hafnium, titanium, aluminum, ruthenium, metal carbides, metal nitrides, transition metal aluminides, tantalum carbide, titanium carbide, tantalum magnesium carbide, or combinations thereof. The first replacement gate electrode 185 may be formed using any suitable metal deposition technique, including, for example, CVD, PVD, and ALD, sputtering, and plating.

Following the deposition of the first replacement gate dielectric and the first replacement gate electrode 185, excess material may be planarized, using, for example, CMP to remove excess material and expose the dummy gate 135 in second region 20 and third region 30. Additionally, planarization removes the second and third region mask that was used to protect the second region 20 and third region 30 during the RMG process occurring in the first region.

Figure 10:
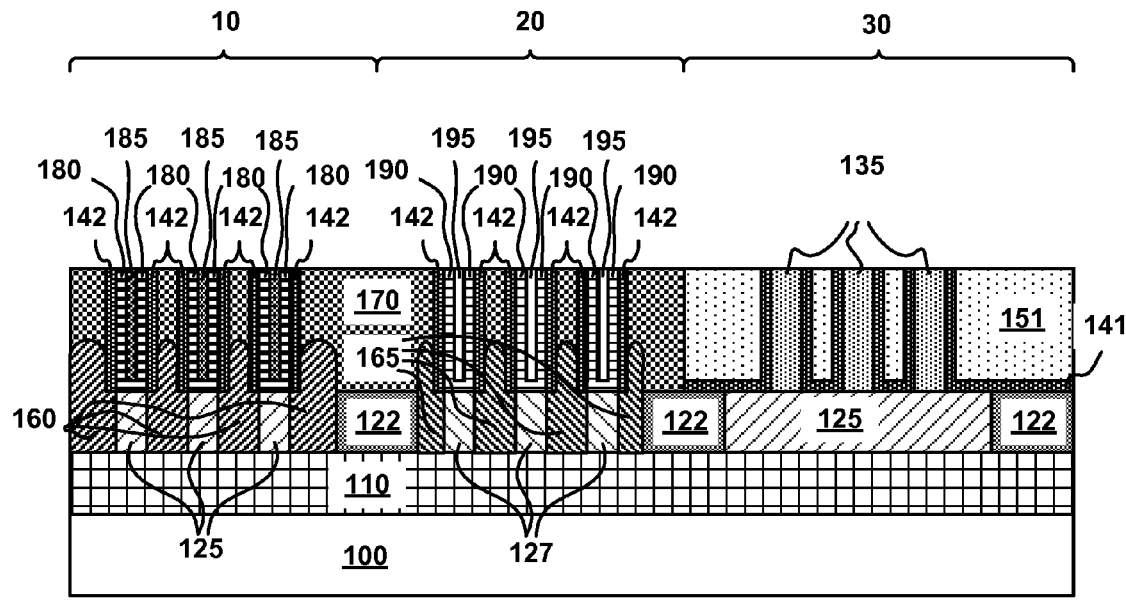
FIG. 10 is a cross-sectional view depicting depositing a gate stack and metal gate in the second region.

Referring to FIG. 10, the first region 10 and third region 30 may be masked and the dummy gate 135 in the second region 20 may be replaced with a replacement metal gate (i.e. a second replacement gate dielectric 190, work function layer and a second replacement gate electrode 195). In an exemplary embodiment, the first and third region mask may be made of oxides, nitrides, and oxynitrides of silicon, as well as oxides, nitrides, and oxynitrides of other elements, and may have a thickness of approximately 2 nm to approximately 10000 nm, preferably approximately 2 nm to approximately 200 nm. The second and third region mask may be deposited using any suitable method known in the art such as, for example, CVD, or spin-on deposition, and then may be etched to expose the second region 20. The first and third region mask may be etched using lithographic patterning and etching techniques typically known in the art, such as RIE and plasma etching.

The dummy gate 135 may be removed from the second region 20 by selectively etching the dummy gate using an isotropic or an anisotropic etching process such as, for example, RIE, wet etching or plasma etching (not shown).

Following the removal of the dummy gate, a second replacement gate dielectric 190 may be deposited. In one embodiment, the second replacement gate dielectric 190 may include silicon oxide ($Si_xO_y$) or a high-k oxide such as, for example, hafnium oxide ($Hf_xO_y$), zirconium oxide ($Zr_xO_y$), aluminum oxide ($Al_xO_y$), titanium oxide ($Ti_xO_y$), lanthanum oxide ($La_xO_y$), strontium titanium oxide ($Sr_xTi_yO_z$), lanthanum aluminum oxide ($La_xAl_yO_z$), and mixtures thereof. The second replacement gate dielectric 190 may be deposited over the second SOI layer 135 using any suitable deposition technique known the art, including, for example, ALD, CVD, PVD, MBD, PLD, or LSMCD.

Following the deposition of the second replacement gate dielectric 190, in some embodiments a work function metal layer may be deposited. The work function metal layer may include, for example, aluminum, lanthanum oxide, magnesium oxide, strontium titanate, strontium oxide, TiN, TaN. The work function metal layer may be formed using any suitable metal deposition technique, including, for example, CVD, PVD, and ALD, sputtering, and plating.

In some embodiments, a high temperature anneal may be performed prior to the deposition of the gate electrode. The high temperature anneal may be performed in order to increase the performance of the replacement metal gate stack. The high temperature anneal may be performed at temperatures ranging from approximately 600° Celsius to approximately 1100° Celsius and may be annealed for approximately a few milliseconds to approximately 30 seconds. In some embodiments, the annealing temperature may be substantially uniform throughout the annealing period, however in other embodiments the annealing period include one or more ramping cycles where the temperature is decreased or increased. Following the anneal, additional work function metal layers, dielectric layer or any other layers known in the art may be deposited.

A second replacement gate electrode 195 may be deposited above the second replacement gate dielectric 190 or work function layer. The second replacement gate electrode 195 may be made of gate conductor materials including, but not limited to, zirconium, tungsten, tantalum, hafnium, titanium, aluminum, ruthenium, metal carbides, metal nitrides, transition metal aluminides, tantalum carbide, titanium carbide, tantalum magnesium carbide, or combinations thereof. The second replacement gate electrode 195 may be formed using any suitable metal deposition technique, including, for example, CVD, PVD, and ALD, sputtering, and plating.

Following the deposition of the first replacement gate dielectric and the second replacement gate electrode 195, excess material may be planarized using, for example, CMP to remove excess material and expose the dummy gate 135 in the third region 30. Additionally, planarization removes the first and third region mask that was used to protect the first region 10 and third region 30 during the RMG process occurring in the second region.

Figure 20:
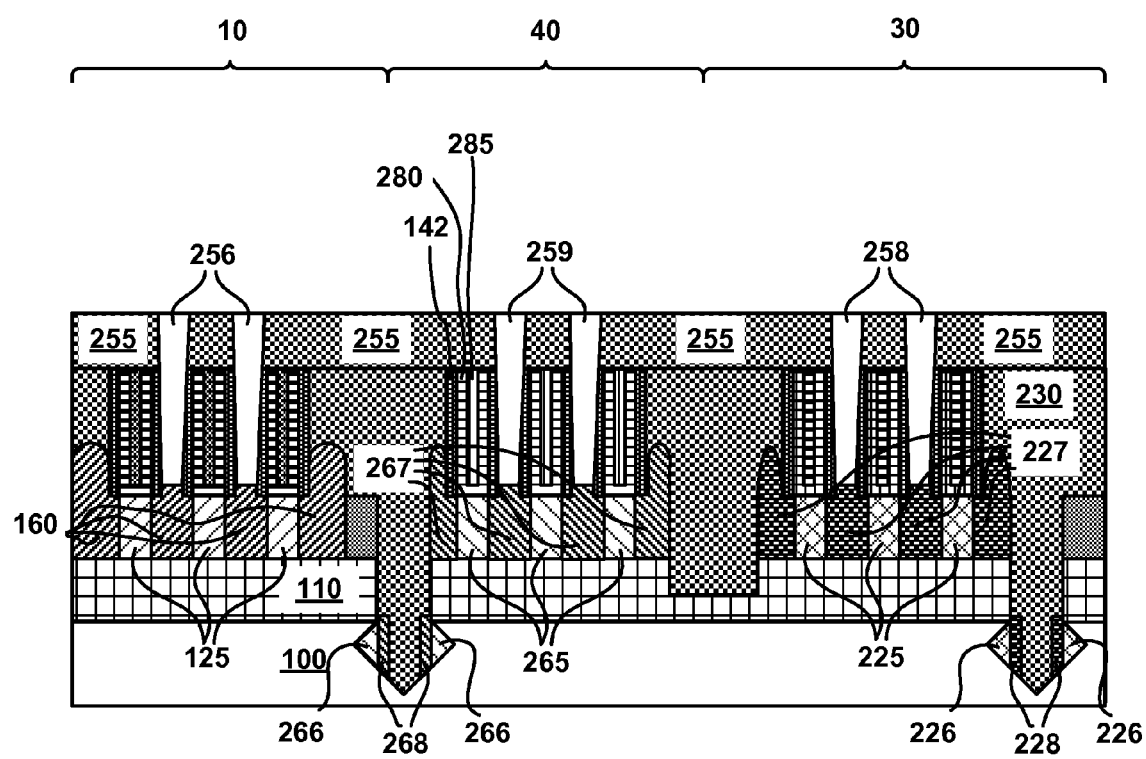
FIG. 20 is a cross-sectional view depicting an alternative embodiment of the semiconductor structure.

FIG. 11-16 illustrate an example embodiment, where the original first SOI layer 125 is removed, and is replaced with a third alternate semiconductor on insulator layer 225. In the example method and embodiments, the material of the third SOI layer 225 would be negatively impacted by the processing steps (e.g. temperature) for forming the FET and FinFET in the first region 10 and second region 20. For example, in instances where III-V semiconductor materials are chosen, FIG. 11-16 may be used to create the third SOI layer 225 so that it does not withstand process temperatures above 700° C. Additionally, the methods described in FIG. 11-16 may be performed multiple times on an SOC, creating multiple regions with, for example, temperature adverse semiconductor materials. An example of such a device is illustrated in FIG. 20.

Figure 11:
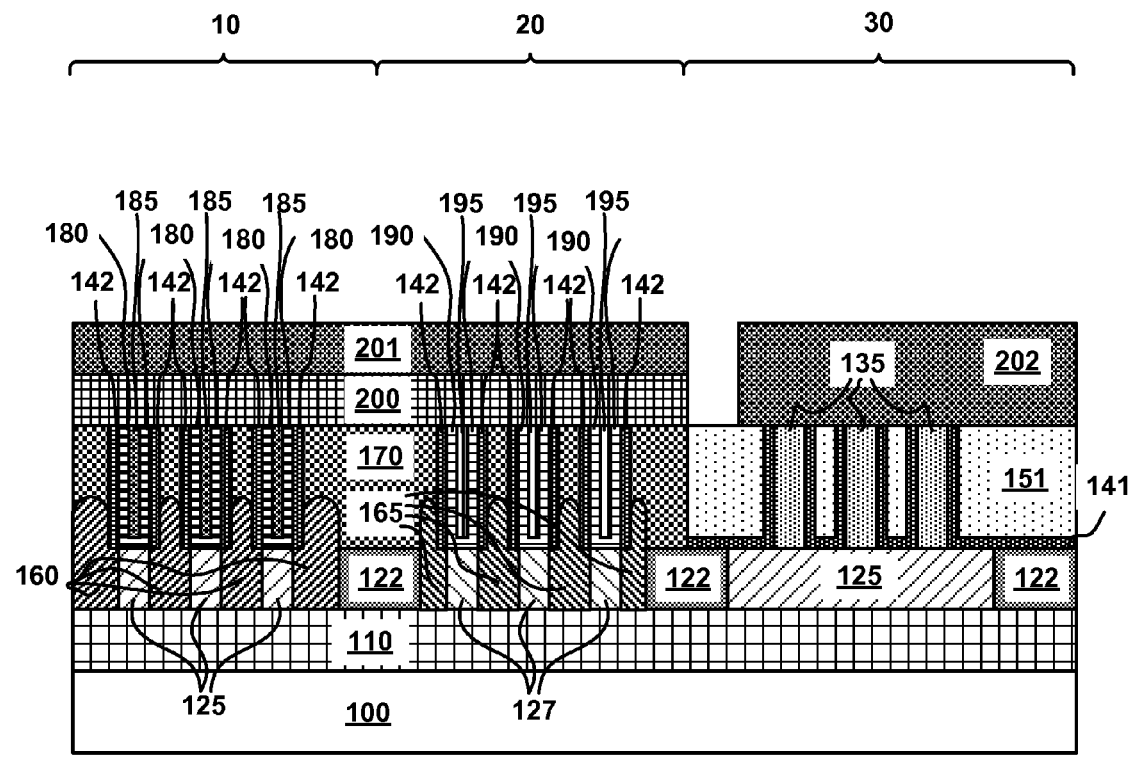
FIG. 11 is a cross-sectional view depicting depositing a hardmask over the first and second region, and a lithographic mask exposing a portion of the third region.

Referring to FIG. 11, a first and second region masking layer 200 may be deposited above the first region 10 and second region 20. The first and second region masking layer 200 may be deposited to protect the first region 10 and second region 20 during subsequent processing steps, as well as prevent undesired growth of semiconductor material on the structures in the first region 10 and second region 20. In an exemplary embodiment, the first and second region masking layer 200 may be made of oxides, nitrides, and oxynitrides of silicon, as well as oxides, nitrides, and oxynitrides of other elements, and may have a thickness of approximately 2 nm to approximately 10000 nm, preferably approximately 2 nm to approximately 200 nm. The first and second region masking layer 200 may be etched to expose the third region 30 using lithographic patterning and etching techniques typically known in the art, such as reactive ion etching (RIE) and plasma etching.

Still referring to FIG. 11, a first lithographic layer 201 and a second lithographic layer 202 may be formed. The first lithographic layer 201 may be formed above the first and second region masking layer 200. The second lithographic layer 202 may be formed to cover a portion of the third region 30. The portion of the third region 30 that is not covered by the second lithographic layer 202 contains at least a part of the first SOI layer 125 in the third region, and additionally may contain a portion of the STI layer 122 in the third region 30. The first lithographic layer 201 and second lithographic layer 202 may be formed by depositing a lithographic material on the exposed surfaces of the first region 10, second region 20 and third region 30, and patterning the desired structure using light. Suitable lithographic materials include, for example, a photoresist layer which is self-planarized during resist coating process.

Figure 12:
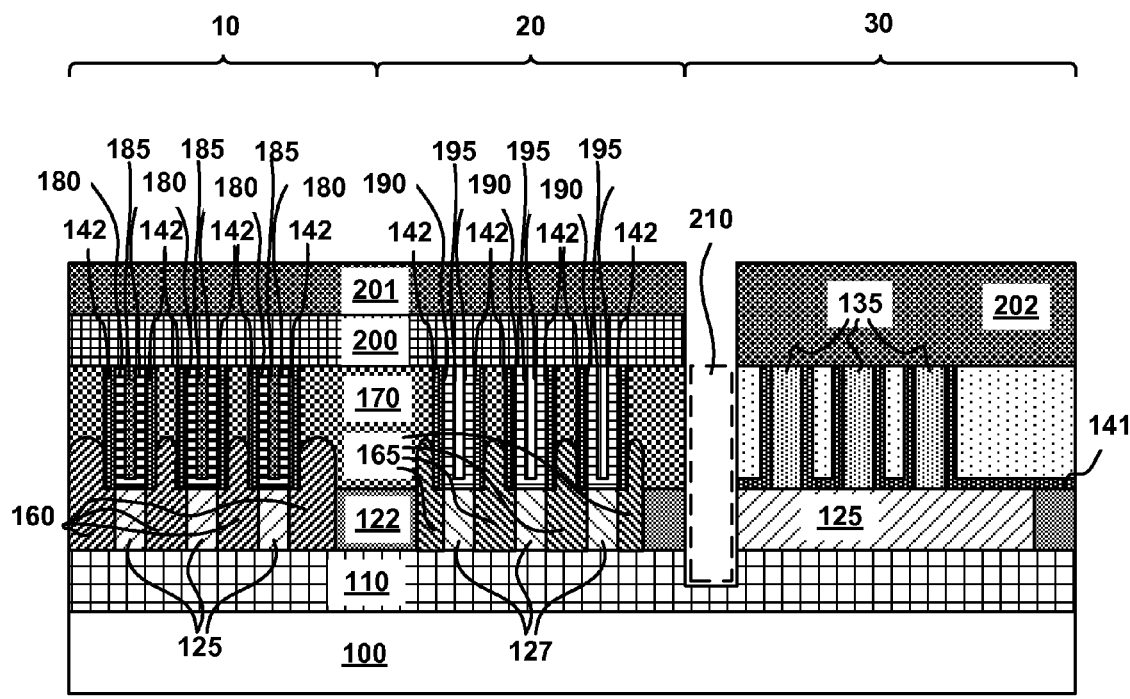
FIG. 12 is a cross-sectional view depicting performing an anisotropic etch on the exposed third region to create an exhaust void.

Referring to FIG. 12, an etch process step may be performed to remove the material beneath the exposed portion of the third region 30, creating an exhaust void 210. Etching may be accomplished by any suitable technique, such as, for example, anisotropic RIE. The etch step is performed such that at least a surface of the first SOI layer 125 in the third region 30 is exposed. In additional embodiments, the etch may occur to at least the top surface of the buried insulator layer 110, or may remove a portion of buried insulator layer 110.

Figure 13:
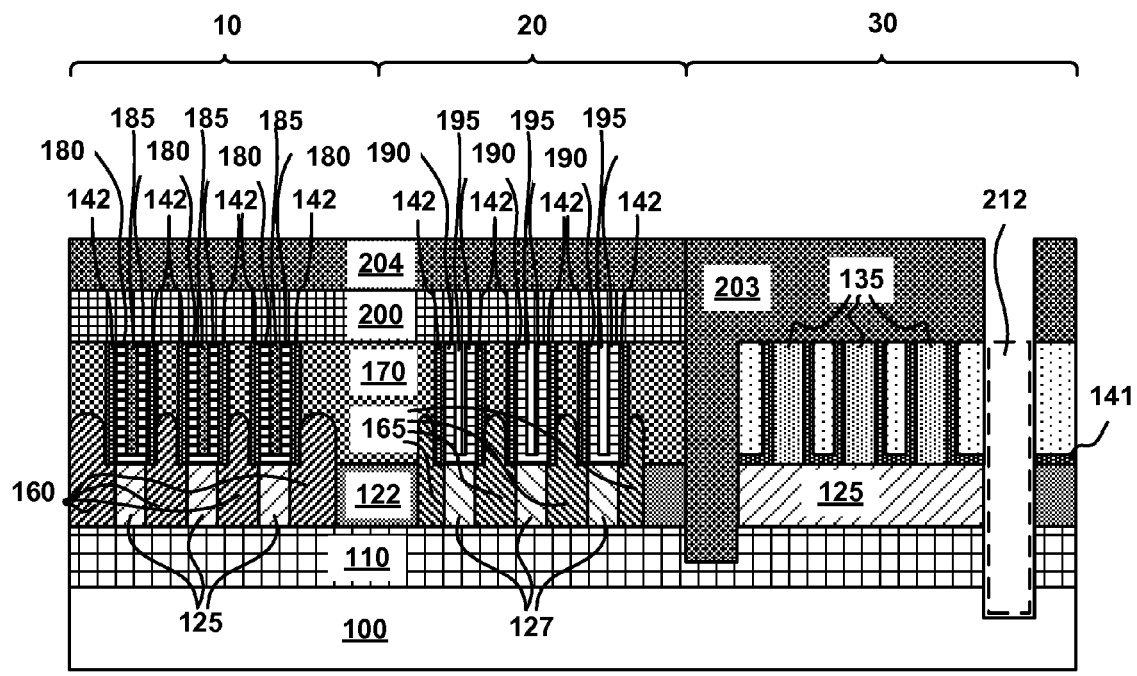
FIG. 13 is a cross-sectional view depicting depositing a lithographic mask exposing a different portion of the third region, and performing an anisotropic etch on the exposed portion of the third region to create a growth void.

Referring to FIG. 13, the first lithographic layer 201 and the second lithographic layer 202 may be removed, and a fourth lithographic layer 204 and a third lithographic layer 203 may be formed. The first lithographic layer 201 and the second lithographic layer 202 may be removed using any suitable solvent or etching technique capable of removing photoresist without damaging the underlying structures, such as utilizing an oxygen plasma process. The fourth lithographic layer 204 may be formed above the first and second region masking layer 200. The third lithographic layer 203 may be formed to cover a portion of the third region 30. The portion of the third region 30 that is not covered by the third lithographic layer 203 contains at least a part of the first SOI layer 125 in the third region 30, and additionally may contain a portion of the STI layer 122 in the third region 30. The fourth lithographic layer 204 and third lithographic layer 203 may be formed by depositing a lithographic material on the exposed surfaces of the first region 10, second region 20 and third region 30, and patterning the desired structure using light. Suitable lithographic materials include, for example, a photoresist layer.

Still referring to FIG. 13, an etch process step may be performed to remove the material beneath the exposed portion of the third region 30, creating a growth void 212. Etching may be accomplished by any suitable technique, such as, for example, RIE or wet stripping. The etch step is performed such that at least a surface of the base semiconductor layer 100 is exposed, creating a growth void 212 extending from at least the surface of the base semiconductor layer 100 to the surface of the planarized third region mask 151.

Figure 14:
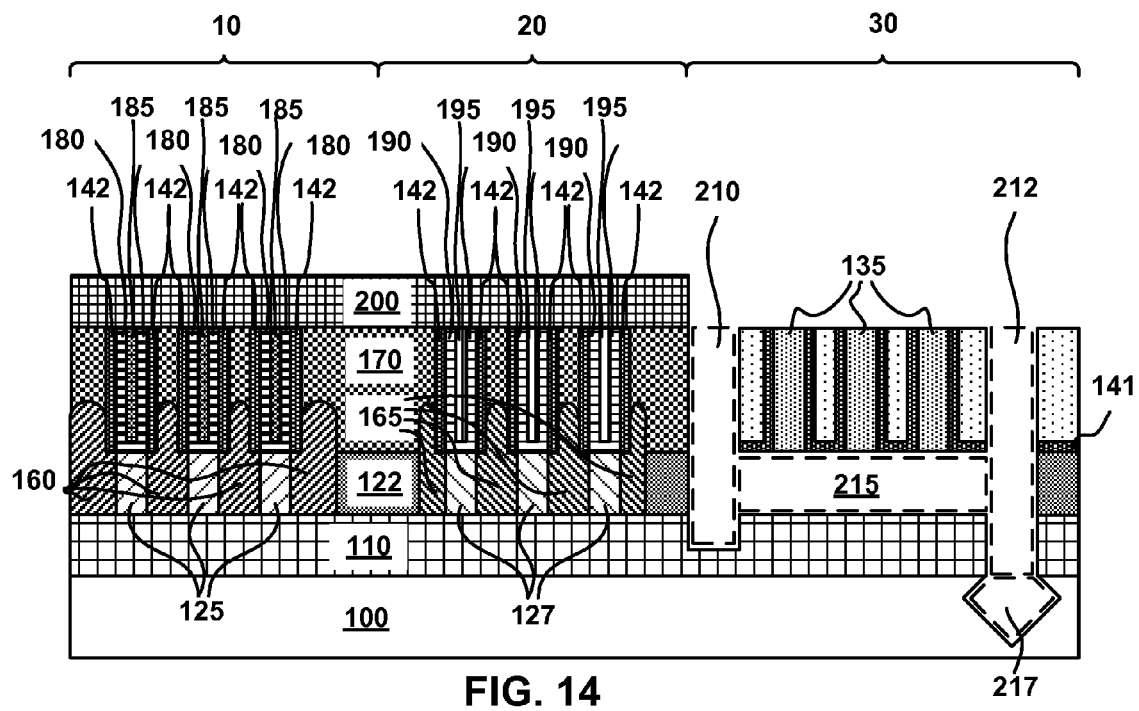
FIG. 14 is a cross-sectional view depicting performing an etch to remove the portion of the semiconductor located in the beneath the dummy gates, and forming a refresh void in the substrate.

Referring to FIG. 14, the fourth lithographic layer 204 and the third lithographic layer 203 may be removed, the remaining portion of SOI layer 125 in the third region may be removed and the base semiconductor layer 100 may be etch to create a surface to encourage later epitaxial growth. The fourth lithographic layer 204 and the third lithographic layer 203 may be removed using any suitable solvent or etching technique capable of removing photoresist without damaging the underlying structures.

Still referring to FIG. 14, SOI layer 125 may be removed, creating a FET void 215, and a portion of substrate may be removed, creating seed void 217, using an isotropic or some anisotropic etches. If an anisotropic etch is used, horizontal anisotropic etching processes should be selected that enable the removal of unexposed regions beneath structures already present, such as a timed wet or gaseous etch process using, for example, tetramethylammonium hydroxide (TMAH). In other embodiments, gaseous hydrogen chloride (HCl) may be used in lieu of, or in addition to TMAH. The duration of the etch process may determine the depth and shape of the angled recessed corner 167. In an exemplary embodiment, approximately 300 sccm HCl gas in approximately 35 slm of a carrier gas, such as hydrogen, may be flowed into a process chamber at approximately 650° C. for a time ranging from approximately 10 seconds to approximately 30 seconds. The etch time may be less than 10 seconds or greater than 30 seconds depending on the other etch process parameters, including etchant (e.g., HCl or TMAH) flow rate, carrier gas flow rate, and temperature. Following the etch, all, or substantially all, of the first SOI layer 125 should be removed from the third region 30.

Prior to anisotropic etching the base semiconductor layer 100 may have a <110> crystal lattice structure, which will etch faster than planes having a <111> crystal lattice structure. As the etch progresses, the <110> plane of the base semiconductor layer 100 may be etched away to expose <111> planes angled inward away from the base semiconductor layer 100. These <111> planes may form the boundary of the seed void 217. If the etch proceeds to the point where the <111> planes intersect, then the angled recess region 167 may be v-shaped. Otherwise, the seed void 217 may be sigma-shaped.

Additionally, the base semiconductor layer 100 may be etched to form the seed void 217 beneath the growth void 215. In instances where the seed void 217 is created with the anisotropic etch described above, the seed void 217 may be v-shaped, as depicted in FIG. 14. In other embodiments, the seed void 217 may have a sigma-shaped recess, with an approximately vertical sidewall connecting the two angled faces of the recess (not shown). In embodiments using isotropic etches, the seed void may take on various other shapes (e.g. ellipsoidal), based on the specific etch characteristics. The seed void 217 may extend horizontally beneath the buried insulator layer 110, and the etch may refresh the surface of the base semiconductor layer 100 in order to enable subsequent epitaxial growth on the exposed surface of the base semiconductor layer 100.

Figure 15:
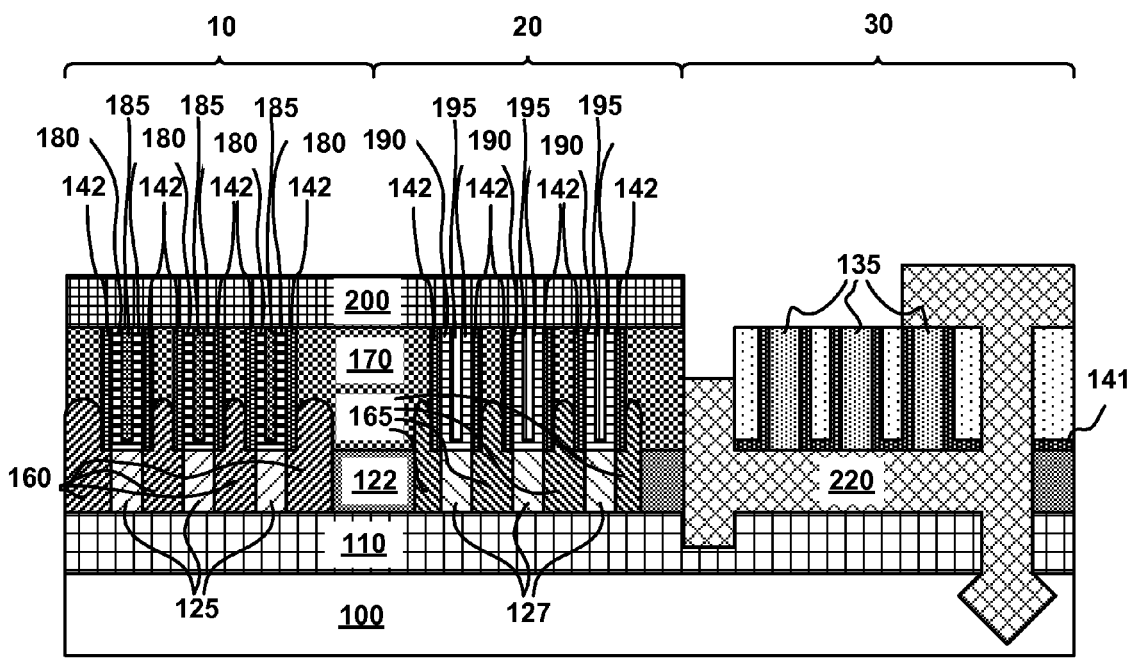
FIG. 15 is a cross-sectional view depicting reforming a semiconductor layer in the third region, using the substrate as a growth template.

Referring to FIG. 15 epi-layer 220 is epitaxially grown, starting from the seed void 217, through the FET void 215, and up the exhaust void 210 and growth void 212. Additionally, various other conditioning techniques or methods that may increase the device performance may be performed. In an embodiment, the semiconductor material of the epi-layer 220 may be epitaxially on the existing crystal lattice of the base semiconductor layer 100. The semiconductor material of the epi-layer 220 can include a compound semiconductor which can be selected as needed for a particular semiconductor structure from any type of IIIA and VA elements (III-V semiconductor compounds), mixed III-V compounds, group II (A or B) and VIA elements (II-VI semiconductor compounds) and mixed II-VI compounds, and IV-VI compounds, and additionally may include high-germanium content Silicon-Germanium (x, Ge % close to 1). Examples include gallium arsenide (GaAs), gallium indium arsenide (InGaAs), gallium aluminum arsenide (GaAlAs), indium phosphide (InP), cadmium sulfide (CdS), cadmium mercury telluride (CdHgTe), zinc selenide (ZnSe), zinc sulfur selenide (ZnSSe), lead selenide (PbSe), lead telluride (PbTe), lead sulfide selenide (PbSSe) and similar compounds.

EPI-layer 220 may be formed by selective epitaxial growth in any suitable deposition system. For example, metal organic chemical vapor deposition (MOCVD), atmospheric pressure CVD, low or reduced pressure CVD, ultra-high vacuum CVD, molecular beam epitaxy (MBE) or atomic layer deposition (ALD) techniques can be employed. For example, MOCVD may be used to epitaxially grow indium gallium arsenide (In0.5-0.7GaAs), first in the growth void and eventually to overgrow the seed void 217 to fill the entire FET void 215, and at least parts of the exhaust void 210 and growth void 212.

Figure 16:
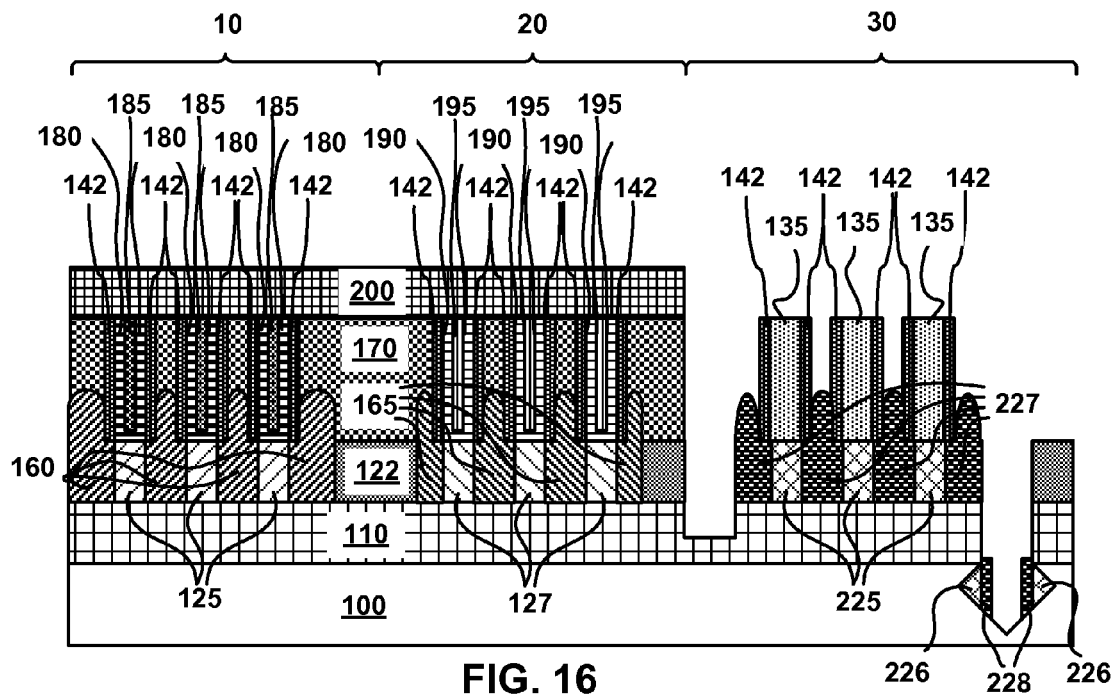
FIG. 16 is a cross-sectional view depicting forming a S/D Junction in the third region.

Referring to FIG. 16, the overgrowth of epi-layer 220 is removed, forming a third SOI layer 225, and a third source/drain 227 is formed in the third region 30. The overgrowth of the epi-layer 220 may be removed using a RIE process, removing all of the epi-layer 220 that existed in exhaust void 210, growth void 215 and the region of the seed void 217 that is covered by the buried insulator layer 110, leaving a third SOI layer growth remnant 226. The third SOI layer growth remnant 226 may be located on at least the surfaces of base semiconductor layer 100 that were exposed to seed void 217, and additionally may only be located on in the portion of the seed void 217 that were covered by buried insulator layer 110. Additionally, the third region mask 150 may be etched using lithographic patterning and etching techniques typically known in the art, such as reactive ion etching (RIE) and plasma etching, in order to expose the third SOI layer 225, in order to form the third source/drain 227. Further, RIE etching of the partial spacer layer 141 located on the horizontal surfaces of the third region removes the spacer material, leaving spacers 142 on the vertical sections of the dummy gate 135 in the third region 30.

The third source/drain 227 is formed in the source/drain region of the third SOI layer 225. The third source/drain 227 may result a semiconductor material epitaxially grown on the third SOI layer 225 and annealed at moderate temperatures, below 700° C. In some embodiments, a semiconductor material may be epitaxially grown on the existing crystal lattice of the third SOI layer 225 in the third region 30. Additionally, material intended for the third source/drain 227 may grow in the growth void 217, forming a growth void source/drain growth 228. The growth void source/drain growth 228 may grow in the seed void 217, and may be located on the exposed surfaces of the third SOI layer growth remnant 226 and/or the base semiconductor layer 100. In an example embodiment, the semiconductor material may be a binary or ternary group III-V semiconductor such as GaAs or $In_{1-x}Ga_xAs$. In such an embodiment, the semiconductor material may contain, for example, approximately 0% to approximately 100% gallium, approximately 0% to approximately 100% indium, and may be doped with n-type dopants such as silicon, germanium, tellurium, selenium in concentrations ranging from approximately $8×10^{19}$ atoms/cm$^3$ to approximately $1×10^{21}$ atoms/cm$^3$.

Additionally, ion implantation may performed to introduce desired dopants into the third SOI layer 225 in the third region 30. In some embodiments, dopants may include any suitable semiconductor dopant such as, for example, silicon, germanium and combinations thereof. The dopant may be implanted in concentrations ranging from approximately $1×10^{18}$ atoms/cm$^3$ to approximately $5×10^{19}$ atoms/cm$^3$.

Figure 17:
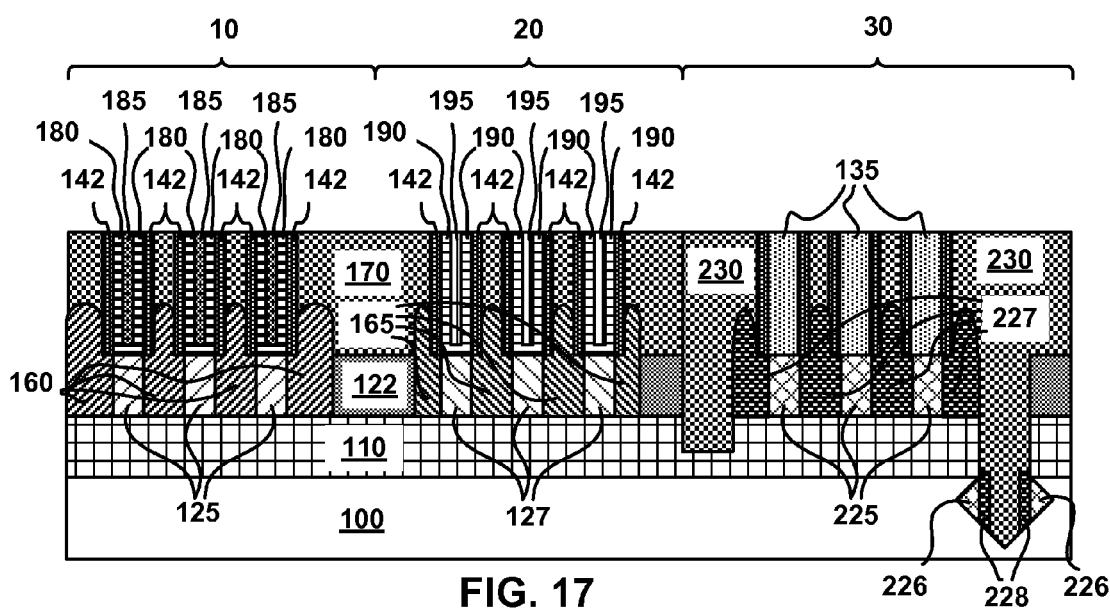
FIG. 17 is a cross-sectional view depicting depositing an ILD in the third region, and performing CMP on the three regions.

Referring to FIG. 17, a third region ILD layer 230 may be deposited to surround the dummy gates 135 and spacers 142 in the third region 30. The third region ILD layer 230 may include any suitable dielectric material, for example, silicon oxide, silicon nitride, hydrogenated silicon carbon oxide, silicon based low-k dielectrics, flowable oxides, porous dielectrics, or organic dielectrics including porous organic dielectrics and may be formed using any suitable deposition techniques including ALD, CVD, plasma enhanced CVD, spin on deposition, or PVD. In some embodiments, the third region ILD layer 230 may be a dummy ILD. In some embodiments, various barriers or liners (not shown) may be formed below the third region ILD layer 230. After deposition, the third region ILD layer 230 may be planarized, using, for example, CMP to remove excess material and expose the dummy gate 135 in the first region 10, second region 20 and third region 30, so that the ILD layer 140 has approximately the same height.

Figure 18:
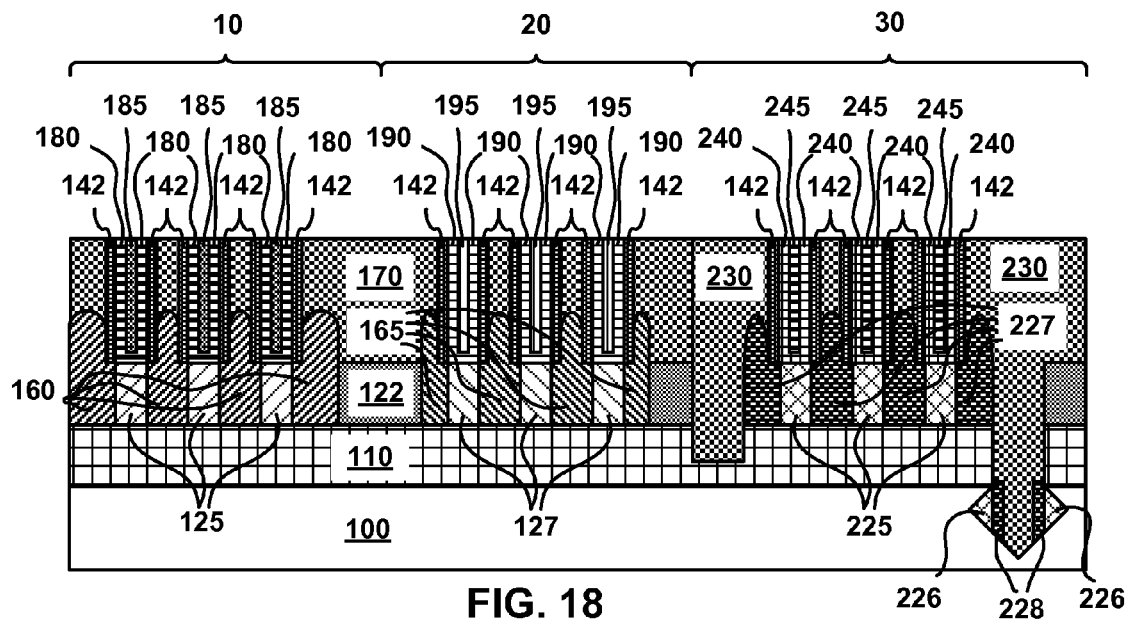
FIG. 18 is a cross-sectional view depicting depositing a gate stack and metal gate in the third region.

Referring to FIG. 18, the first region 10 and second region 20 may be masked and the dummy gate 135 in the third region 30 may be replaced with a replacement metal gate (i.e. a third replacement gate dielectric 240, work function layer and a third replacement gate electrode 245). In an exemplary embodiment, the first and third region mask may be made of oxides, nitrides, and oxynitrides of silicon, as well as oxides, nitrides, and oxynitrides of other elements, and may have a thickness of approximately 2 nm to approximately 10000 nm, preferably approximately 2 nm to approximately 200 nm. The second and third region mask may be deposited using any suitable method known in the art such as, for example, CVD, or spin-on deposition, and then may be etched to expose the third region 30. The first and third region mask may be etched using lithographic patterning and etching techniques typically known in the art, such as RIE and plasma etching.

The dummy gate 135 may be removed from the third region 30 by selectively etching the dummy gate using an isotropic or an anisotropic etching process such as, for example, RIE, wet etching or plasma etching (not shown).

Following the removal of the dummy gate, a third replacement gate dielectric 240 may be deposited. In one embodiment, the third replacement gate dielectric 240 may include silicon oxide ($Si_xO_y$) or a high-k oxide such as, for example, hafnium oxide ($Hf_xO_y$), zirconium oxide ($Zr_xO_y$), aluminum oxide ($Al_xO_y$), titanium oxide ($Ti_xO_y$), lanthanum oxide ($La_xO_y$), strontium titanium oxide ($Sr_xTi_yO_z$), lanthanum aluminum oxide ($La_xAl_yO_z$), and mixtures thereof. The third replacement gate dielectric 240 may be deposited over the second SOI layer 135 using any suitable deposition technique known the art, including, for example, atomic layer deposition (ALD), chemical vapor deposition (CVD), physical vapor deposition (PVD), molecular beam deposition (MBD), pulsed laser deposition (PLD), or liquid source misted chemical deposition (LSMCD).

Following the deposition of the third replacement gate dielectric 240, in some embodiments a work function metal layer may be deposited. The work function metal layer may include, for example, aluminum, lanthanum oxide, magnesium oxide, strontium titanate, strontium oxide, TiN, TaN, tungsten, palladium, nickel, platinum or any combination of. The work function metal layer may be formed using any suitable metal deposition technique, including, for example, CVD, PVD, and ALD, sputtering, and plating.

A third replacement gate electrode 245 may be deposited above the third replacement gate dielectric 240 or work function layer. The third replacement gate electrode 245 may be made of gate conductor materials including, but not limited to, zirconium, tungsten, tantalum, hafnium, titanium, aluminum, ruthenium, metal carbides, metal nitrides, transition metal aluminides, tantalum carbide, titanium carbide, tantalum magnesium carbide, or combinations thereof. The third replacement gate electrode 245 may be formed using any suitable metal deposition technique, including, for example, CVD, PVD, and ALD, sputtering, and plating.

Following the deposition of the first replacement gate dielectric and the third replacement gate electrode 245, excess material may be planarized, using, for example, CMP to remove excess material and expose the dummy gate 135 in second region 20 and third region 30. Additionally, planarization removes the first and second region mask that was used to protect the first region 10 and second region 20 during the RMG process occurring in the first region.

Figure 19:
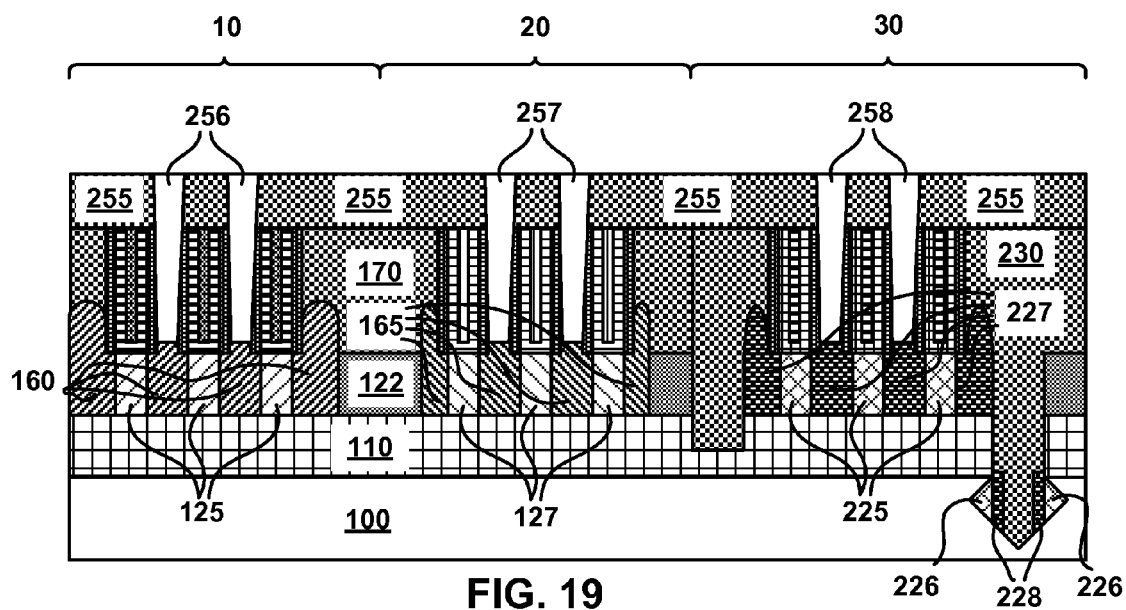
FIG. 19 is a cross-sectional view depicting depositing an ILD above each region, and forming a contact with the S/D Junction in each region.

With reference to FIG. 19, a $M_{x+1}$ dielectric 255 may be deposited over the structure, and subsequent damascene or dual damascene structures may be created. The $M_{x+1}$ dielectric 130 may electrically insulate the underlying FET structures from additional interconnect levels (not shown). The $M_{x+1}$ dielectric 130 may be deposited using typical deposition techniques, for example, chemical vapor deposition. The $M_{x+1}$ dielectric 255 may include any suitable dielectric material, for example, silicon nitride ($Si_3N_4$), silicon carbide (SiC), silicon carbon nitride (SiCN), hydrogenated silicon carbide (SiCH), or other known capping materials. The $M_{x+1}$ dielectric 255 may have a thickness ranging from about 20 nm to about 60 nm and ranges there between, although a thickness less than 20 nm and greater than 60 nm may be acceptable.

In an optional embodiment, Self Aligned Contacts (SAC) may be formed prior to the formation of the $M_{x+1}$ dielectric 255, at the top of the gate structure. In such an embodiment, a top portion of the gate may be etched away, selective to the rest of the structure and a conductive material may be deposited in its place. The conductive material may include, for example, copper, aluminum, or tungsten. SAC may be formed using a filing technique such as electroplating, electroless plating, chemical vapor deposition, physical vapor deposition or a combination of methods.

Still referring to FIG. 19, a damascene opening may be formed in the $M_{x+1}$ dielectric. The damascene opening may include a trench opening and two via openings. The damascene opening may be formed using any suitable masking and etching technique known in the art. In one embodiment, a dry etching technique using a fluorine based etchant, such as, for example $C_xF_y$, may be used. In one embodiment, the depth of the trench opening may range from about 50 nm to about 100 nm. Also, the via openings may extend vertically from the bottom of the trench opening down to the top of the first source/drain 160, the second source/drain 165 and the third source/drain 227.

Still referring to FIG. 19, a first conductive interconnect 256, a second conductive interconnect 257, a second conductive interconnect 258, may be formed within the damascene opening, and contacting the first source/drain 160, the second source/drain 165 and the third source/drain 227 respectively. Each set of conductive interconnects may contain a liner and a metal fill may be deposited in via recess. The liner may be made of, for example, tantalum or tantalum nitride, and may include one or more layers of liner material. The metal fill may include, for example, copper, aluminum, or tungsten. The liner and metal fill may be formed using a filing technique such as electroplating, electroless plating, chemical vapor deposition, physical vapor deposition or a combination of methods.

Following the formation of contacts, a structure may exist where a first and second region contain semiconductor structures that have undergone high temperature processing, such as a reliability anneal, while the semiconductor material in the third region, which is temperature adverse, has avoided those processes that would be destructive. The structures in the first region, second region and third region may be located at the same level of the chip, and reduce the need for 3-D stacking of the structures on a single chip, which will aid in integration of temperature sensitive materials into semiconductor structures. Additionally, in the third region 30 the third SOI layer growth remnant 226, and the growth void source/drain growth 228, may be located at the same level as base semiconductor layer 100, and below the buried insulator layer 110. The the third SOI layer growth remnant 226, and the growth void source/drain growth 228 may be electrically isolated from the structures above the buried insulator layer 110 by the buried insulator layer 110 and the portion of the third region ILD 270 that was deposited in the seed void 217. The portion of the third region ILD 270 located in the seed void 217 may be surrounded by the growth void source/drain growth 228 on its horizontal surfaces.

FIG. 20 depicts an alternative embodiment where steps presented in FIG. 11-16 have been performed twice to form gate structures in 2 separate regions, the third region 30 and fourth region 40. In such an embodiment, the semiconductor structure in the third region 30 may be the same as the structure described above. The semiconductor structure in the fourth region 40 may contain a fourth SOI material 265, and a fourth source/drain material 267. The fourth SOI layer 227 may be different from the third SOI layer 225, and may be selected as a material that is sensitive to anneal temperatures used during gate formation. Additionally, the order of replacing the first SOI layer 125 with the third SOI layer 225 and the fourth SOI layer 265, as described in the steps in FIG. 11-16, may be done such that the most temperature sensitive material is formed last, and thus would avoid any issues from unnecessary temperature. For example, the fourth SOI layer 265 may be germanium and may be formed prior to the third SOI layer 225, which may be a III-V semiconductor material. Additionally, the structure located in the fourth region 40 has similar characteristics of the structure located in the third region 30, such as a fourth SOI layer growth remnant 266, and a fourth region growth void source/drain growth 268, may be located at the same level as base semiconductor layer 100, and beneath the buried insulator 110. Additionally, similar techniques and materials as those described above may be used for the RMG process when forming the fourth region dielectric 280 and fourth region electrode 285, as well as for fourth region contact 259. Additionally, replacing the first SOI layer 125 in the third region 30 and fourth region 40, and subsequently forming the third SOI layer 225 and fourth SOI layer 265, may use the same exhaust void located between the third region 30 and fourth region 40.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A method for forming a semiconductor device comprising:
   forming a first gate structure on a first region of a semiconductor-on-insulator substrate, wherein the semiconductor-on-insulator substrate comprises a first semiconductor-on-insulator layer located on an insulator layer, and the insulator layer is located on a base semiconductor layer, and wherein the first gate structure comprises a first gate structure located above the first semiconductor-on-insulator layer, and a first source/drain sandwiching the first gate structure;
   forming a second gate structure in a second region of the semiconductor-on-insulator substrate, wherein the second gate structure is located above the first semiconductor-on-insulator layer;

removing a first portion of the second region to expose a first growth portion of the base semiconductor layer in the second region;

removing the first semiconductor-on-insulator layer in the second region, wherein removing the semiconductor-on-insulator layer comprises removing the semiconductor-on-insulator layer beneath the second gate structure forming a gate void;

forming a second semiconductor-on-insulator layer through the gate void, wherein the second semiconductor-on-insulator layer is epitaxially grown from the first growth portion of the base semiconductor layer in the second region.

2. The method of claim 1, wherein forming the first gate structure comprises an anneal above a temperature that would deteriorate the second semiconductor-on-insulator layer.

3. The method of claim 1, further comprising forming a second source/drain sandwiching the second gate structure.

4. The method of claim 1, wherein removing the semiconductor-on-insulator layer in the second region comprises an isotropic etch or a horizontal anisotropic etch.

5. The method of claim 1, wherein forming the first gate structure comprises:
forming a dummy gate;
removing the dummy gate;
depositing a gate dielectric in the first gate structure; and
depositing a gate electrode above the gate dielectric.

6. The method of claim 1, further comprising depositing an ILD layer above the second region of the semiconductor-on-insulator substrate prior to removing the first portion of the second region.

7. The method of claim 1, wherein the first semiconductor-on-insulator layer comprises one of: silicon and silicon-germanium.

8. The method of claim 1, wherein the second semiconductor-on-insulator layer comprises one of: germanium, a III-V semiconductor compound and a II-VI semiconductor compound.

9. The method of claim 1, wherein removing the first portion of the second region comprises reactive ion etching.

10. The method of claim 1, further comprising removing the second semiconductor layer from the first portion of the second region.

11. The method of claim 10, wherein removing the first semiconductor-on-insulator layer in the second region comprises a lateral etch of the base semiconductor beneath the insulator layer; and wherein removing the grown semiconductor layer the first portion of the second region retains a portion of the second semiconductor-on-insulator layer located in the region created by the lateral etch.

12. The method of claim 1, further comprising removing a second portion of the second region to expose a portion of the insulator layer in the second region, and wherein the second portion of the second region is on the opposite side of the second gate structure from the first portion of the second region.

13. The method of claim 12, further comprising forming a third gate structure in a third region of the semiconductor-on-insulator substrate, wherein the third gate structure is located above the first semiconductor-on-insulator layer;
removing a first portion of the third region to expose a second growth portion of the base semiconductor layer in the second region, wherein the first portion of the third region is located on the opposite side of the third gate structure from the second portion of the second region;
removing the first semiconductor-on-insulator layer in the third region, wherein removing the semiconductor-on-insulator layer comprises removing the semiconductor-on-insulator layer beneath the second gate structure forming a second gate void;
forming a third semiconductor-on-insulator layer through the gate void, wherein the third semiconductor-on-insulator layer is epitaxially grown from the second growth portion of the base semiconductor layer in the third region.

14. The method of claim 1, wherein forming the second gate structure in the second region of the semiconductor-on-insulator substrate comprises forming a dummy gate.

15. The method of claim 14, further comprising:
removing the dummy gate after forming a second semiconductor-on-insulator layer through the gate void;
depositing a gate dielectric in the second gate structure; and
depositing a gate electrode above the gate dielectric.

* * * * *